(12) United States Patent
Okumura et al.

(10) Patent No.: US 10,022,758 B2
(45) Date of Patent: Jul. 17, 2018

(54) SUBSTRATE PROCESSING APPARATUS AND METHOD FOR DETECTING CLOGGING OF EXHAUST PIPE IN SUBSTRATE PROCESSING APPARATUS

(71) Applicant: Tokyo Electron Limited, Tokyo (JP)

(72) Inventors: Tomonori Okumura, Kumamoto (JP); Takashi Ajishi, Kumamoto (JP); Keisuke Tsugao, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/198,705

(22) Filed: Jun. 30, 2016

(65) Prior Publication Data

US 2017/0008044 A1   Jan. 12, 2017

(30) Foreign Application Priority Data

Jul. 8, 2015   (JP) .................... 2015-136669

(51) Int. Cl.
*B08B 9/032* (2006.01)
*F16K 37/00* (2006.01)
(Continued)

(52) U.S. Cl.
CPC ........ *B08B 9/0325* (2013.01); *C11D 11/0047* (2013.01); *G05D 7/0635* (2013.01);
(Continued)

(58) Field of Classification Search
CPC ........... C11D 11/0047; H01L 21/67017; H01L 21/67028; H01L 21/67253;
(Continued)

(56) References Cited

U.S. PATENT DOCUMENTS

2001/0035127 A1* 11/2001 Metzner ................ C23C 16/407
118/715
2005/0097730 A1* 5/2005 Yamamoto .......... H01J 37/3244
29/745
(Continued)

FOREIGN PATENT DOCUMENTS

JP   10-055948 A   2/1998
JP   2012-099582 A   5/2012

*Primary Examiner* — Michael Barr
*Assistant Examiner* — Benjamin L Osterhout
(74) *Attorney, Agent, or Firm* — Abelman, Frayne & Schwab

(57) ABSTRACT

Disclosed is a substrate processing apparatus including a chamber, a first measuring unit, an exhaust pipe, a regulation valve, an opening degree detection unit, a valve controller, and a clogging detection unit. The chamber accommodates therein a substrate to be processed by using a processing fluid. The first measuring unit measures an internal pressure of the chamber. An exhaust from the chamber flows through the exhaust pipe. The regulation valve regulates an exhaust volume of the exhaust pipe. The opening degree detection unit detects a valve opening degree of the regulation valve. The valve controller controls the valve opening degree of the regulation valve based on a measurement result of the first measuring unit to keep the internal pressure within a specified range. The clogging detection unit detects clogging of the exhaust pipe based on the valve opening degree detected by the opening degree detection unit.

8 Claims, 9 Drawing Sheets

(51) Int. Cl.
*H01L 21/67* (2006.01)
*G05D 7/06* (2006.01)
*C11D 11/00* (2006.01)

(52) U.S. Cl.
CPC .. *H01L 21/67017* (2013.01); *H01L 21/67028* (2013.01); *H01L 21/67051* (2013.01); *H01L 21/67253* (2013.01); *B08B 2203/0229* (2013.01)

(58) Field of Classification Search
CPC ............ H01L 21/67051; B08B 9/0325; B08B 2203/0229; G05D 7/0635
See application file for complete search history.

(56) References Cited

U.S. PATENT DOCUMENTS

| | | | |
|---|---|---|---|
| 2010/0212588 A1* | 8/2010 | Suda .................. | C30B 15/20 118/663 |
| 2011/0065289 A1* | 3/2011 | Asai ................... | C23C 16/345 438/791 |
| 2012/0304930 A1* | 12/2012 | Verdict ............... | C23C 16/4407 118/715 |

* cited by examiner

SUBSTRATE PROCESSING APPARATUS AND METHOD FOR DETECTING CLOGGING OF EXHAUST PIPE IN SUBSTRATE PROCESSING APPARATUS

CROSS-REFERENCE TO RELATED APPLICATIONS

This application is based on and claims priority from Japanese Patent Application No. 2015-136669 filed on Jul. 8, 2015 with the Japan Patent Office, the disclosure of which is incorporated herein in its entirety by reference.

TECHNICAL FIELD

Exemplary embodiments disclosed herein relate to a substrate processing apparatus and a method for detecting clogging of an exhaust pipe in the substrate processing apparatus.

BACKGROUND

Conventionally, a substrate processing apparatus has been known which performs various processings on a substrate (e.g., a silicon wafer or a compound semiconductor wafer) by using a processing fluid such as, for example, an alkaline processing liquid or an acid processing liquid (see, e.g., Japanese Patent Laid-Open Publication No. 2012-099582).

In the conventional technology, the substrate is accommodated in a chamber to be subject to various processings, and an exhaust pipe is connected to the chamber so as to exhaust the atmosphere of the chamber therethrough.

However, the exhaust flowing through the exhaust pipe may contain components of the processing fluid, and in this case, a product (e.g., a crystal) may be attached to the exhaust pipe thereby causing clogging of the exhaust pipe such as, for example, a reduction of a flow path cross-sectional area of the exhaust pipe. Thus, in the conventional technology, a cleaning processing is periodically performed to wash off the product by supplying a cleaning liquid into the exhaust pipe.

SUMMARY

A substrate processing apparatus according to an aspect of an exemplary embodiment includes a chamber, a first measuring unit, an exhaust pipe, a regulation valve, an opening degree detection unit, a valve controller, and a clogging detection unit. The chamber accommodates therein a substrate to be processed by using a processing fluid. The first measuring unit measures an internal pressure of the chamber. The exhaust pipe is connected to the chamber, and an exhaust from the chamber flows through the exhaust pipe. The regulation valve is provided in the exhaust pipe and regulates an exhaust volume of the exhaust pipe. The opening degree detection unit detects a valve opening degree of the regulation valve. The valve controller controls the valve opening degree of the regulation valve based on a result of the measurement of the first measuring unit to keep the internal pressure within a specified range. The clogging detection unit detects clogging of the exhaust pipe based on the valve opening degree detected by the opening degree detection unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
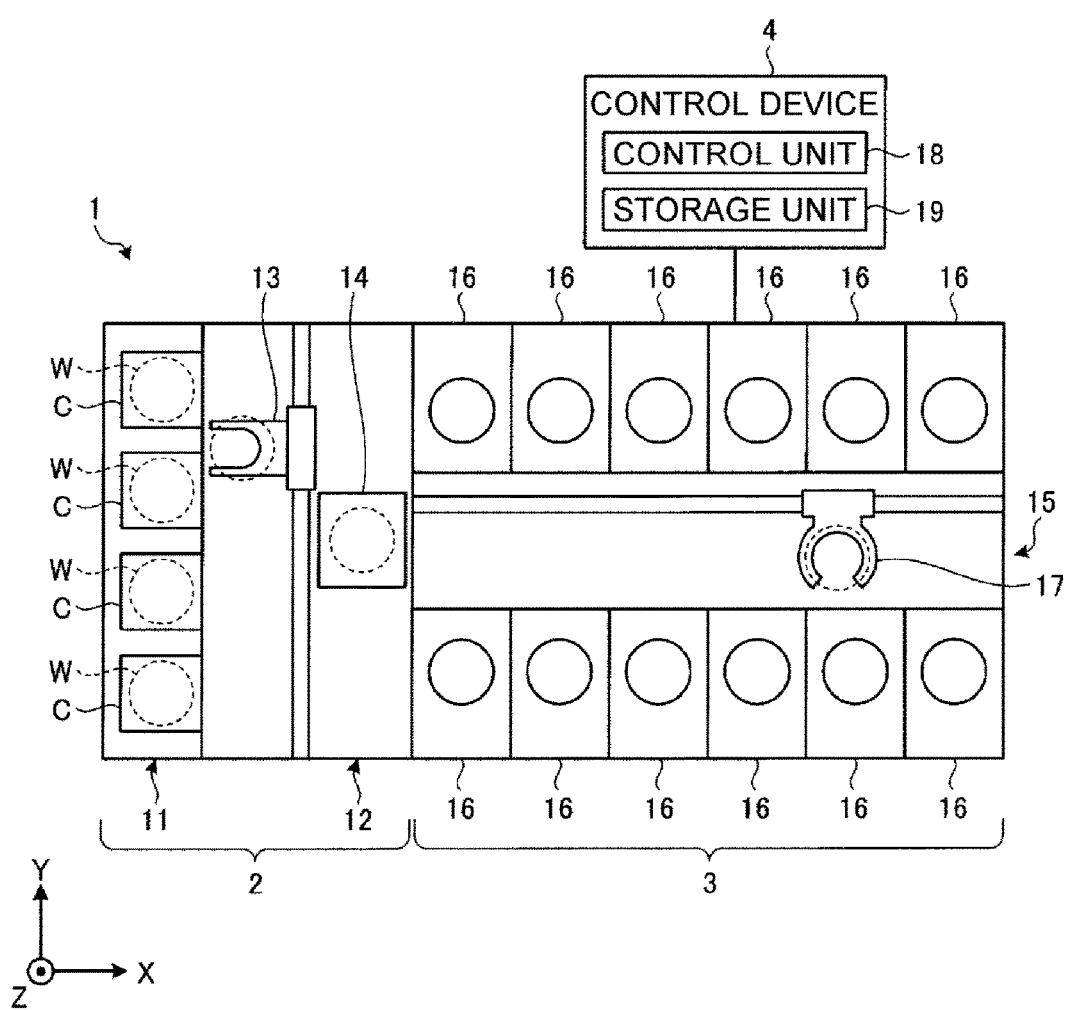
FIG. 1 is a view illustrating a schematic configuration of a substrate processing system according to a first exemplary embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In the above-described conventional technology, even though the cleaning processing was periodically performed, the occurrence of clogging itself in the exhaust pipe could not be found out. Thus, a technique capable of detecting an occurrence of clogging in the exhaust pipe has been demanded.

An object of an aspect of an exemplary embodiment is to provide a substrate processing apparatus in which an occurrence of clogging in an exhaust pipe can be detected, and a method for detecting clogging of an exhaust pipe in the substrate processing apparatus.

A substrate processing apparatus according to an aspect of an exemplary embodiment includes a chamber, a first measuring unit, an exhaust pipe, a regulation valve, an opening degree detection unit, a valve controller, and a clogging detection unit. The chamber accommodates therein a substrate to be processed by using a processing fluid. The first measuring unit measures an internal pressure of the chamber. The exhaust pipe is connected to the chamber, and an exhaust from the chamber flows through the exhaust pipe. The regulation valve is provided in the exhaust pipe and regulates an exhaust volume of the exhaust pipe. The opening degree detection unit detects a valve opening degree of the regulation valve. The valve controller controls the valve opening degree of the regulation valve based on a result of the measurement of the first measuring unit to keep the internal pressure within a specified range. The clogging detection unit detects clogging of the exhaust pipe based on the valve opening degree detected by the opening degree detection unit.

The substrate processing apparatus further includes a cleaning liquid supply unit configured to supply a cleaning liquid into the exhaust pipe, and a cleaning controller configured to control the cleaning liquid supply unit to supply the cleaning liquid into the exhaust pipe when clogging of the exhaust pipe is detected by the clogging detection unit.

The substrate processing apparatus further includes a second measuring unit provided at an upstream side of the exhaust pipe in an exhaust flow direction in comparison with the regulation valve and configured to measure a pressure of the exhaust pipe. The clogging detection unit specifies a clogging occurring site in the exhaust pipe based on the pressure of the exhaust pipe measured by the second measuring unit.

The clogging detection unit specifies that the clogging occurring site is a site of the upstream side in the exhaust flow direction in comparison with the second measuring unit when the pressure of the exhaust pipe measured by the second measuring unit has decreased to be lower than a preset pressure, and specifies that the clogging occurring site is a site of a downstream side in comparison with the second measuring unit when the pressure of the exhaust pipe has increased to be higher than the preset pressure.

The exhaust pipe is disposed such that the site of the downstream side in the exhaust flow direction is positioned vertically above the site of the upstream side, and an upstream cleaning liquid supply unit is provided at the upstream side of the exhaust pipe in comparison with the second measuring unit to supply the cleaning liquid into the exhaust pipe.

The substrate processing apparatus further includes a substrate holding mechanism disposed within the chamber and configured to hold a substrate, a recovery cup disposed to surround the substrate held by the substrate holding mechanism and configured to recover a drainage in a substrate processing, a recovery cup exhaust pipe connected to the recovery cup to allow an exhaust from the recovery cup to flow therethrough, and which joins with the exhaust pipe at the downstream side in the exhaust flow direction, and a third measuring unit provided in the recovery cup exhaust pipe and configured to measure a pressure of the recovery cup exhaust pipe. The clogging detection unit specifies which one of the exhaust pipe and the recovery cup exhaust pipe is the clogging occurring site, based on the pressure of the exhaust pipe measured by the second measuring unit and the pressure of the recovery cup exhaust pipe measured by the third measuring unit.

Provided is a method for detecting clogging of an exhaust pipe in a substrate processing apparatus including: a chamber configured to accommodate therein a substrate to be processed by using a processing fluid; a first measuring unit configured to measure an internal pressure of the chamber; an exhaust pipe connected to the chamber to allow exhaust from the chamber to flow therethrough; a regulation valve provided in the exhaust pipe and configured to regulate an exhaust volume of the exhaust pipe; an opening degree detection unit configured to detect a valve opening degree of the regulation valve; a valve controller configured to control the valve opening degree of the regulation valve; and a clogging detection unit configured to detect clogging of the exhaust pipe. The method includes: measuring an internal pressure of the chamber by the first measuring unit; detecting a valve opening degree of a regulation valve by the opening degree detection unit; controlling the valve opening degree of the regulation valve by the valve controller based on a measurement result in the internal pressure measuring step to keep the internal pressure within a specified range; and detecting clogging of the exhaust pipe by the clogging detection unit based on the valve opening degree detected by the opening degree detecting step.

The substrate processing apparatus further includes a cleaning liquid supply unit configured to supply a cleaning liquid into the exhaust pipe, and a cleaning controller configured to control the cleaning liquid supply unit to supply the cleaning liquid into the exhaust pipe. The above-described method further includes supplying the cleaning liquid into the exhaust pipe from the cleaning liquid supply unit when clogging of the exhaust pipe is detected by the clogging detection unit.

In the above-described method, the substrate processing apparatus further includes a second measuring unit provided at an upstream side of the exhaust pipe in an exhaust flow direction in comparison with the regulation valve and configured to measure a pressure of the exhaust pipe, and the clogging detection unit specifies a clogging occurring site in the exhaust pipe based on the pressure of the exhaust pipe measured by the second measuring unit.

According to the aspect of the exemplary embodiment, in the substrate processing apparatus, the occurrence of clogging in the exhaust pipe may be detected.

Hereinafter, detailed descriptions will be made on exemplary embodiments of the substrate processing apparatus and the method for detecting clogging of an exhaust pipe in the substrate processing apparatus according to the present disclosure with reference to the accompanying drawings. The present disclosure is not limited to the exemplary embodiments.

(First Exemplary Embodiment)

<1. Configuration of Substrate Processing System According to First Exemplary Embodiment>

FIG. 1 is a view illustrating a schematic configuration of a substrate processing system according to the present exemplary embodiment. In the following, in order to clarify the positional relationship, the X-axis, Y-axis, and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C are placed to accommodate a plurality of substrates, i.e., semiconductor wafers (hereinafter, "wafers W") in the present exemplary embodiment, horizontally.

The transfer section 12 is provided adjacent to the carrier placing section 11, and provided with a substrate transfer device 13 and a delivery unit 14 therein. The substrate transfer device 13 is provided with a wafer holding mechanism configured to hold the wafer W. Further, the substrate transfer device 13 is movable horizontally and vertically and pivotable around a vertical axis. The substrate transfer device 13 transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16.

The plurality of processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then, places the taken wafer W on the transfer unit 14. The wafer W placed on the transfer unit 14 is taken out from the transfer unit 14 by the substrate transfer device 17 of the processing station 3, and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
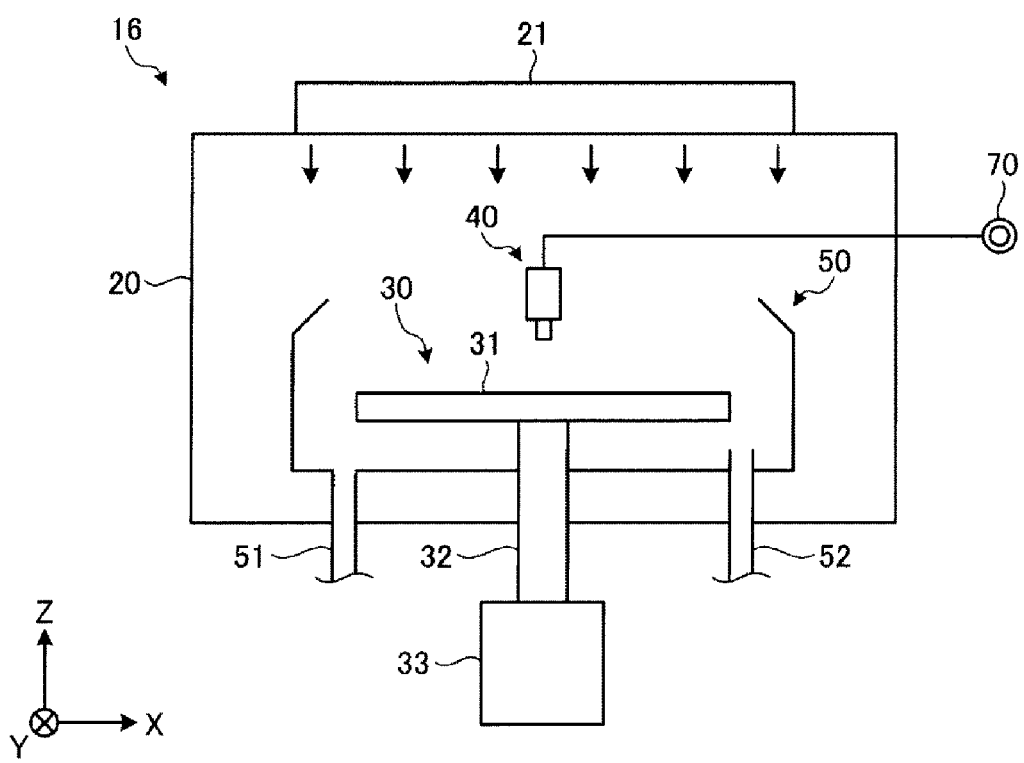
FIG. 2 is a view illustrating a schematic configuration of a processing unit.

Next, a schematic configuration of the processing unit 16 of the substrate processing system 1 will be described with reference to FIG. 2. FIG. 2 is a view illustrating a schematic configuration of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow within the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid supply source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

<2. Specific Configuration of Processing Unit>

Figure 3:
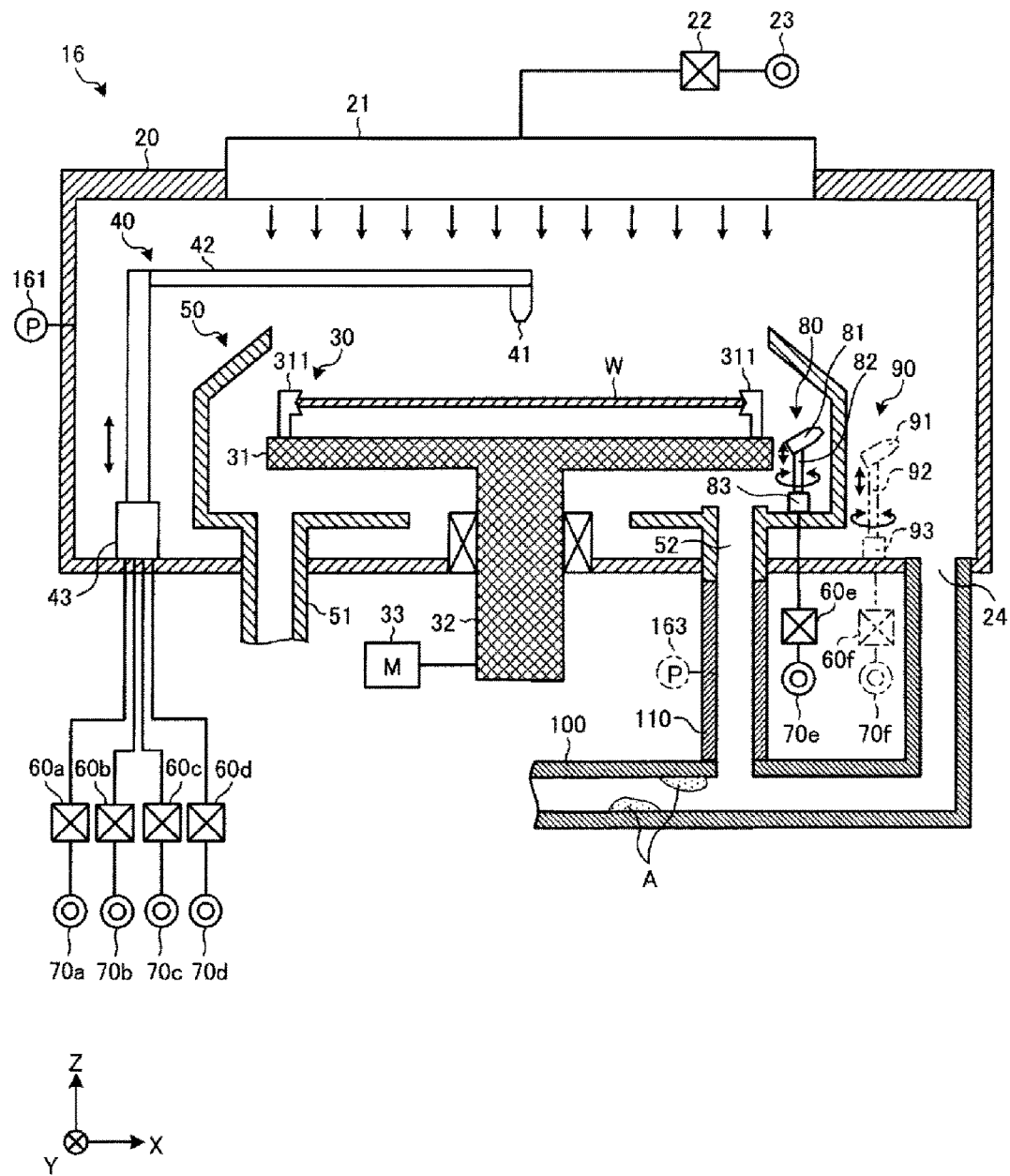
FIG. 3 is a schematic view of an exemplary specific configuration of the processing unit.

Next, the configuration of the processing unit 16 will be described in more detail with reference to FIG. 3. FIG. 3 is a schematic view illustrating an exemplary specific configuration of the processing unit 16.

As illustrated in FIG. 3, an inert gas supply source 23 is connected to the FFU 21 through a valve 22. The FFU 21 feeds an inert gas (e.g., $N_2$ gas) supplied from the inert gas supply source 23 into the chamber 20. In addition, the FFU 21 may feed air cleaned by an ultra low penetration air (ULPA) filter into the chamber 20.

A holding member 311 is provided on the top surface of the holding unit 31 provided in the substrate holding mechanism 30 to hold the wafer W from the lateral side of the wafer W. The wafer W is horizontally held by the holding member 311 in a state of being slightly spaced apart from the top surface of the holding unit 31.

The processing fluid supply unit 40 includes a nozzle 41, an arm 42 that supports the nozzle 41 horizontally, and a pivoting and lifting mechanism 43 that pivots and lifts the arm 42. One end of a pipe (not illustrated) is connected to the nozzle 41, and the other end thereof is branched into a plurality of pipes. An alkali-based processing liquid supply source 70a, an acid-based processing liquid supply source 70b, an organic-based processing liquid supply source 70c, and a DIW supply source 70d are connected to the ends of the branched pipes, respectively. Further, valves 60a to 60d are provided between the respective supply sources 70a to 70d and the nozzle 41.

The processing fluid supply unit 40 supplies an alkali-based processing liquid, an acid-based processing liquid, an organic-based processing liquid, and DIW (room-temperature pure water) supplied from the supply sources 70a to 70d, respectively, onto a surface (a surface to be processed) of the wafer W from the nozzle 41. As described above, the chamber 20 accommodates therein the wafer W which is processed by using various kinds of processing liquids.

In the present exemplary embodiment, SC1 (a mixed solution of ammonia, hydrogen peroxide, and water) is used as the alkali-based processing liquid, hydrofluoric acid (HF) is used as the acid-based processing liquid, and isopropyl alcohol (IPA) is used as the organic-based processing liquid. In addition, the acid-based processing liquid, the alkali-based processing liquid, and the organic-based processing liquid are not limited to those described above.

In addition, in the present exemplary embodiment, the alkali-based processing liquid, the acid-based processing liquid, and the organic-based processing liquid, and the DIW are supplied from the single nozzle 41, but the processing fluid supply unit 40 may be provided with a plurality of nozzles corresponding to the processing liquids, respectively.

In addition, the processing unit 16 further includes a recovery cup cleaning liquid supply unit 80. The recovery cup cleaning liquid supply unit 80 is used for a cup cleaning processing of cleaning the inner wall of the recovery cup 50.

The recovery cup cleaning liquid supply unit 80 includes a nozzle 81, an arm 82 that supports the nozzle 81, and a pivoting and lifting mechanism 83 that pivots and lifts the arm 82. The nozzle 81 is connected to a DIW supply source 70e through a valve 60e. This recovery cup cleaning liquid supply unit 80 ejects DIW supplied from the DIW supply source 70e as a cleaning liquid toward the inner wall of the recovery cup 50 from the nozzle 81 so as to clean the recovery cup 50.

In addition, the recovery cup cleaning liquid supply unit 80 is configured to also supply the DIW to an exhaust port 52 of the recovery cup 50. The recovery cup cleaning liquid supply unit 80 is also used for a processing of cleaning an exhaust pipe 100 or a recovery cup exhaust pipe 110 by supplying the DIW to the exhaust port 52, and this will be described later.

Subsequently, the exhaust of the processing unit 16 will be described. An exhaust port 24 is formed at the bottom portion of the chamber 20 to discharge the atmosphere within the chamber 20 to the outside of the processing unit 16. The exhaust pipe 100 is connected to the exhaust port 24 of the chamber 20, and the exhaust from the chamber 20 flows through the exhaust pipe 100.

In addition, the recovery cup exhaust pipe 110 is connected to the exhaust port 52 of the recovery cup 50, and the exhaust from the recovery cup 50 flows through the recovery cup exhaust pipe 110. Specifically, one end of the recovery cup exhaust pipe 100 at the upstream side is connected to the exhaust port 52, and the other end thereof at the downstream side is connected to the exhaust pipe 100. That is, the recovery cup exhaust pipe 110 joins with the exhaust pipe 100 at the downstream side in the exhaust direction.

In addition, in the descriptions herein, terms such as, for example, "upstream" and "downstream" mean "upstream" and "downstream" in the flow direction of the exhaust discharged from, for example, the chamber 20 or the recovery cup 50.

In the processing unit 16 according to the present exemplary embodiment, a processing on the wafer W is performed by using a processing fluid such as, for example, the above-described acid processing liquid or alkaline processing liquid. When such a processing is performed within the chamber 20 of the processing unit 16, the exhaust flowing through the exhaust pipe 100 or the recovery cup exhaust pipe 110 may contain, for example, components of the processing fluid.

When the exhaust contains components of the processing fluid, a product A such as, for example, a crystal may be produced and attached to, for example, the exhaust pipe 100. In addition, in FIG. 3, the product attached to the exhaust pipe 100 is represented by a reference symbol A and exaggeratively illustrated for the convenience of understanding.

When the product A is attached to the exhaust pipe 100, clogging such as, for example, a reduction of the flow path cross-sectional area occurs. Hence, the conventional technology implements a removal of the product A by periodically supplying a cleaning liquid to, for example, the exhaust pipe 100.

However, in the conventional technology, even though the cleaning processing was periodically performed, the occurrence of clogging itself in the exhaust pipe 100 could not be found out. Further, since the cleaning was performed even when the product A was absent, the consumption of the cleaning liquid may increase, and a reduction of throughput may be caused by an increase of processing time.

Thus, the substrate processing system 1 according to the present exemplary embodiment is configured such that the occurrence of clogging in the exhaust pipe 100 can be detected. Further, in the present exemplary embodiment, the substrate processing system 1 is configured such that a cleaning processing is performed when clogging in the exhaust pipe 100 is detected, thereby, suppressing the increase of the cleaning liquid consumption or the reduction of throughput. Hereinafter, this configuration will be described in detail.

Figure 4:
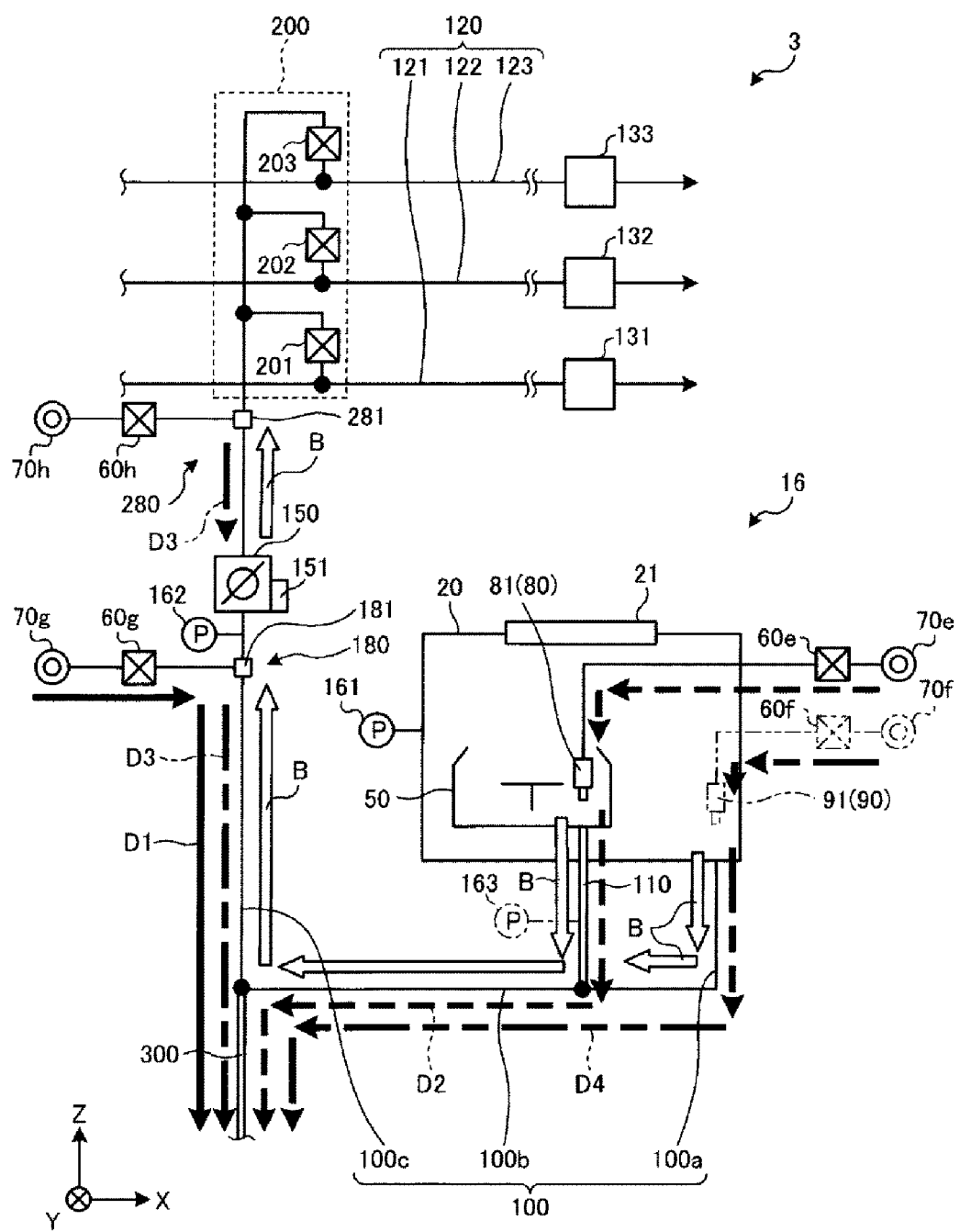
FIG. 4 is a view illustrating an exhaust path of the processing unit.

FIG. 4 is a view illustrating an exhaust path of the processing unit 16. As illustrated in FIG. 4, the processing station 3 of the substrate processing system 1 includes the above-described exhaust pipe 100 and recovery cup exhaust pipe 110, a main exhaust pipe 120, and an exhaust switch unit 200.

The main exhaust pipe 120 includes a plurality of individual exhaust pipes 121 to 123, and exhausting is performed for the respective kinds of the processing fluids. Specifically, an alkali-based exhaust discharged from the processing unit 16 in the use of SC1, an acid-based exhaust discharged from the processing unit 16 in the use of HF, and an organic-based exhaust discharged from the processing unit 16 in the use of IPA are required to be discharged individually in view of, for example, suppression of an exhaust pipe contamination. Hence, in the substrate processing system 1 according to the present exemplary embodiment, exhaust paths are provided for the alkali-based exhaust, the acid-based exhaust, and the organic-based exhaust, respectively.

Specifically, in the main exhaust pipe 120, the individual exhaust pipe 121 is an exhaust pipe through which the alkali-based exhaust flows, the individual exhaust pipe 122 is an exhaust pipe through which the acid-based exhaust flows, and the individual exhaust pipe 123 is an exhaust pipe through which the organic-based exhaust flows. Exhaust mechanisms 131 to 133 are provided in the individual exhaust pipes 121 to 123, respectively. As the exhaust mechanisms 131 to 133, suction devices such as, for example, pumps may be used. In addition, the individual exhaust pipes 121 to 123 according to the present exemplary embodiment are arranged such that at least portions thereof are positioned vertically above the processing unit 16.

In addition, in the above descriptions, the substrate processing system 1 is provided with the exhaust mechanisms 131 to 133. However, the substrate processing system 1 is not limited thereto. That is, the substrate processing system 1 may be configured such that exhaust mechanisms (not illustrated) are installed in a plant where the substrate processing system 1 is to be provided, and the individual exhaust pipes 121 to 123 are connected to the exhaust mechanisms.

The exhaust pipe 100 is disposed to guide the exhaust from the processing unit 16 to the main exhaust pipe 120. Specifically, the exhaust pipe 100 includes a descending portion 100a that extends downwardly from the exhaust port 24 of the chamber 20 of the processing unit (see FIG. 3), a horizontal portion 100b that is provided at the downstream side of the descending portion 100a and extends horizontally, and an ascending portion 100c that is provided at the downstream side of the horizontal portion 100b and extends vertically upwardly.

In addition, the downstream side of the ascending portion 100c is connected to the portion of the main exhaust pipe 120, which is disposed above the processing unit 16, through the exhaust switch unit 200. Accordingly, the exhaust pipe 100 is disposed such that the site of the downstream side in the exhaust flow direction is positioned vertically above the site of the upstream side. In addition, the above-described recovery cup exhaust pipe 110 is connected to the horizontal portion 100*b* of the exhaust pipe 100.

The exhaust switch unit 200 includes branched pipes that connect the downstream side of the ascending portion 100*c* of the exhaust pipe 100 to the individual exhaust pipes 121 to 123, respectively, and valves 201 to 203 are provided in the branched pipes. Accordingly, the valves 201 to 203 are controlled by the control device 4 (see FIG. 3) depending on a kind of the processing fluid being used within the processing unit 16, and therefore, the alkali-based exhaust, the acid-based exhaust, and the organic-based exhaust are discharged through their corresponding individual exhaust pipes 121 to 123. In addition, in FIG. 4, the flow of the exhaust discharged from the processing unit 16 is represented by a white arrow B.

In addition, a drain unit 300 is provided at the lowest position of the ascending portion 100*c* of the exhaust pipe 100 to discharge the liquid within the exhaust pipe 100 to the outside. In addition, in FIG. 4, the drain unit 300 and the recovery cup exhaust pipe 110 are represented by double lines so as to be discriminated from the exhaust pipe 100. In addition, the position where the drain unit 300 is provided, in the exhaust pipe 100, is not limited to the illustrated example and may be another position such as, for example, a midway position of the horizontal portion 100*b* or the lowest position of the descending portion 100.

The processing unit 16 further includes a regulation valve 150, first and second measuring units 161 and 162, an upstream cleaning liquid supply unit 180, and a downstream cleaning liquid supply unit 280. The regulation valve 150 is provided in, for example, the ascending portion 100*c* of the exhaust pipe 100. The regulation valve 150 is, for example, a butterfly type exhaust damper, and an opening degree thereof is controlled by the control unit 18 of the control device 4 (see FIG. 1) so that the exhaust volume of the exhaust pipe 100 is regulated. This regulation of the exhaust volume will be described later.

An opening degree detection unit 151 is provided in the regulation valve 150 to detect the valve opening degree of the regulation valve 150. As the opening degree detection unit 151, for example, a rotary encoder may be used, and the opening degree detection unit 151 outputs a signal indicating the valve opening degree of the regulation valve 150 to the control device 4.

The first measuring unit 161 is provided in, for example, the chamber 20. The first measuring unit 161 always measures an internal pressure P1 of the chamber 20 and outputs a signal indicating a measuring result to the control device 4.

The second measuring unit 162 is provided in the exhaust pipe 100. Specifically, the second measuring unit 162 is provided at the upstream side of the ascending portion 100*c* of the exhaust pipe 100 in comparison with the regulation valve 150. The second measuring unit 162 measures a pressure P2 of the exhaust pipe 100, exactly, a pressure P2 at a position of the upstream side of the exhaust pipe 100 in comparison with the regulation valve 150, and outputs a signal indicating a measurement result to the control device 4. As the first and second measuring units 161 and 162, for example, pressure sensors may be used.

The upstream cleaning liquid supply unit 180 is provided at the upstream side of the exhaust pipe 100 in comparison with the second measuring unit 162, and supplies the cleaning liquid into the exhaust pipe 100. Specifically, the upstream cleaning liquid supply unit 180 is provided with a nozzle 181 disposed at a position directed toward the inside of the exhaust pipe 100. For the simplification of illustration, FIG. 4 schematically represents the nozzle 181 in a square.

The nozzle 181 is connected to a DIW supply source 70*g* through a valve 60*g*. The upstream cleaning liquid supply unit 180 ejects the DIW supplied from the DIW supply source 70*g* as the cleaning liquid toward the inside of the exhaust pipe 100 from the nozzle 181, so as to clean the inside of the exhaust pipe 100, exactly, the site of the upstream side of the exhaust pipe 100 in comparison with the second measuring unit 162. This processing of cleaning the exhaust pipe 100 will be descried later.

The downstream cleaning liquid supply unit 280 is provided at the site of the downstream side of the exhaust pipe 100 in comparison with the second measuring unit 162, for example, at the site of the downstream side in comparison with the regulation valve 150, and supplies the cleaning liquid into the exhaust pipe 100. Specifically, the downstream cleaning liquid supply unit 280 is provided with a nozzle 281 disposed at a position directed toward the inside of the exhaust pipe 100. For the simplification of illustration, FIG. 4 schematically represents the nozzle 281 in a square.

The nozzle 281 is connected to a DIW supply source 70*h* through a valve 60*h*. The downstream cleaning liquid supply unit 280 ejects the DIW supplied from the DIW supply source 70*h* as the cleaning liquid toward the inside of the exhaust pipe 100 from the nozzle 281, so as to clean the inside of the exhaust pipe 100, exactly, the site of the downstream side of the exhaust pipe 100 in comparison with the second measuring unit 162. This processing of cleaning the exhaust pipe 100 will be descried later. In addition, the above-described recovery cup cleaning liquid supply unit 80, upstream cleaning liquid supply unit 180, and downstream cleaning liquid supply unit 280 are an example of the cleaning liquid supply unit.

As described above, the upstream cleaning liquid supply unit 180, the second measuring unit 162, the regulation valve 150, and the downstream cleaning liquid supply unit 280 are provided in the ascending portion 100*c* of the exhaust pipe 100 in this order from the upstream side. In addition, the upstream cleaning liquid supply unit 180 and the second measuring unit 162 are required to be positioned relatively close to each other.

In the processing unit 16 configured as described above, for example, the regulation valve 150, the upstream cleaning liquid supply unit 180, the downstream cleaning liquid supply unit 280, and the recovery cup cleaning liquid supply unit 80 are controlled by the control device 4.

<3. Specific Configuration of Control Device>

Figure 5:
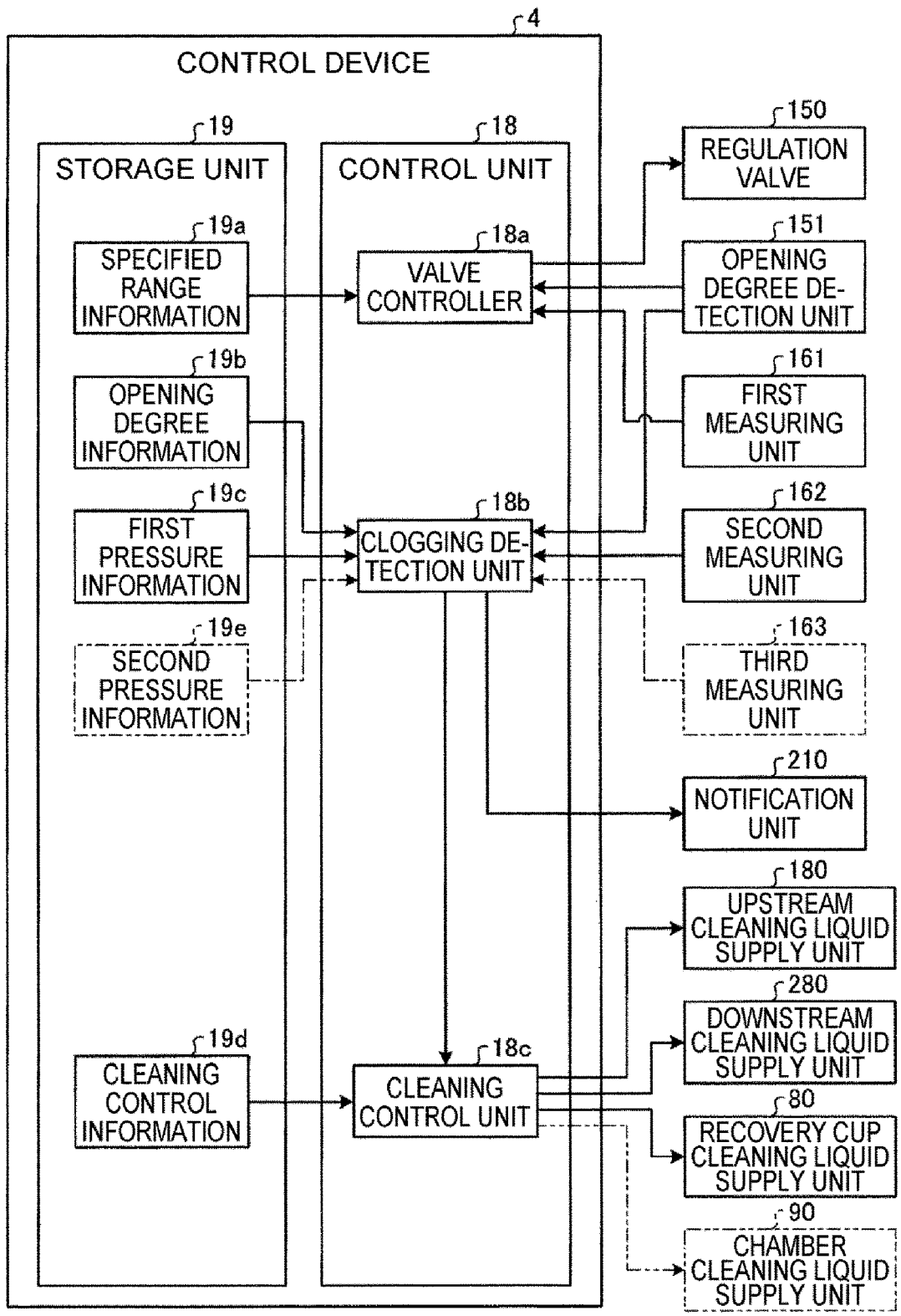
FIG. 5 is a block diagram of a control device.

Next, the control device 4 will be described in more detail with reference to FIG. 5. FIG. 5 is a block diagram of the control device 4. FIG. 5 represents the components required to describe the present exemplary embodiment in functional blocks and omits descriptions of common components.

In other words, each of the components illustrated in FIG. 5 is functionally conceptual, and is not necessarily required to be configured physically as illustrated therein. For example, concrete forms of distribution or integration of the individual functional blocks are not limited to those illustrated, and all or some of the functional blocks may be configured to be functionally or physically distributed or integrated in arbitrary units depending on, for example, various loads or use conditions.

In addition, all or some of the processing functions performed in the individual functional blocks may be implemented by a processor such as, for example, a central processing unit (CPU) and a program analyzed and executed by the processor, or by hardware using a wired logic.

First, as described above, the control device 4 includes the control unit 18 and the storage unit 19 (see FIG. 1). The control unit 18 is, for example, a CPU, and reads and executes a program (not illustrated) stored in the storage unit 19 so as to function as, for example, the individual functional blocks 18a to 18c illustrated in FIG. 5. Subsequently, the individual functional blocks 18a to 18c will be described.

As illustrated in FIG. 5, the control unit 18 includes, for example, a valve controller 18a, a clogging detection unit 18b, and a cleaning controller 18c. In addition, the storage unit 19 stores specified range information 19a, opening degree information 19b, first pressure information 19c, and cleaning control information 19d.

A signal, which indicates the valve opening degree of the regulation valve 150 detected by the opening degree detection unit 151 and the internal pressure P1 of the chamber 20 measured by the first measuring unit 161, is input to the valve controller 18a. Then, the valve controller 18a performs a feedback control for the valve opening degree of the regulation valve 150, based on the measurement result of the first measuring unit 161, so as to keep the internal pressure P1 of the chamber 20 within a specified range.

In addition, the specified range is specified in advance within a range of a negative pressure in order to suppress the atmosphere within, for example, the chamber 20 from being leaked to the outside, and stored as the specified range information 19a in the storage unit 19.

A signal, which indicates the valve opening degree of the regulation valve 150 and the pressure P2 of the exhaust pipe 100 measured by the second measuring unit 162, is input to the clogging detection unit 18b. Then, the clogging detection unit 18b detects clogging of the exhaust pipe 100 based on the valve opening degree of the regulation valve 150 and the pressure P2, and specifies a clogging occurring site when clogging is detected.

More specifically, the clogging detection unit 18b detects clogging of the exhaust pipe 100 when the valve opening degree of the regulation valve 150 becomes a preset opening degree or higher. That is, as described above, the regulation valve 150 is controlled to keep the internal pressure P1 of the chamber 20 within the specified range. Thus, when a product A is attached to, for example, the exhaust pipe 100 so that the flow path cross-sectional area is reduced, the volume of the exhaust flowing through the exhaust pipe 100 is reduced. Then, in the regulation valve 150, the valve body is controlled in a direction that the valve body is opened, that is, the valve body is controlled to increase the valve opening degree, in order to keep the internal pressure P1 of the chamber 20.

Thus, in the clogging detection unit 18b according to the present exemplary embodiment, when the valve opening degree of the regulation valve 150 increases to become the preset opening degree or higher, it is estimated that a product A is being attached to the inside of the exhaust pipe 100, and clogging is detected. As described above, in the clogging detection unit 18b according to the present exemplary embodiment, the occurrence of clogging in, for example, the exhaust pipe 100 may be easily detected based on the valve opening degree of the regulation valve 150. Further, even when a product A is attached to, for example, the exhaust pipe 100, the internal pressure P1 of the chamber 20 is kept within the specified range, and hence, the processing of the wafer W is not affected.

In addition, the above-described preset opening degree is set to a valve opening degree obtained through a test which conducts a feedback control of the regulation valve 150 in a state in which clogging occurs in, for example, the exhaust pipe 100. The set valve opening degree is stored as the opening degree information 19b in the storage unit 19.

In the above descriptions, as the condition for the clogging detection by the clogging detection unit 18, clogging is detected in the case where the valve opening degree becomes the preset opening degree or higher. However, the condition is not limited thereto. That is, clogging may be detected in other cases such as, for example, in a case where the valve opening degree is beyond the preset opening degree range or in a case where the variation width or rate of the valve opening degree is equal to or larger than a preset value.

Subsequently, specifying the clogging occurring site as performed by the clogging detection unit 18b will be described with reference to FIG. 4 as well. Based on the variation of the pressure P2 as the measurement result of the second measuring unit 162, the clogging detection unit 18b specifies whether the clogging occurring site in the exhaust pipe 100 is the site of the upstream side or the downstream side of the exhaust pipe 100 in comparison with the second measuring unit 162.

Specifically, once the clogging detection unit 18b detects the clogging of the exhaust pipe 100 when the valve opening degree of the regulation valve 150 becomes the preset opening degree or higher, the clogging detection unit 18b, then, measures the pressure P2 of the exhaust pipe 100 by the second measuring unit 162.

Then, when the measured pressure P2 has decreased to be lower than a first preset pressure, the clogging detection unit 18b estimates that the decrease is attributed to the reduction of the flow path cross-sectional area in the site of the upstream side in comparison with the second measuring unit 162, and specifies that the clogging occurring site is the site of the upstream side in comparison with the second measuring unit 162.

In addition, the first pressure is set to a value of the pressure P2 measured when no clogging occurs in the exhaust pipe 100, and the first set pressure is stored in advance as the first pressure information 19c in the storage unit 19.

Meanwhile, when the measured pressure P2 has increased to be higher than the first pressure, the clogging detection unit 18b estimates that the increase is attributed to the reduction of the flow path cross-sectional area in the site of the downstream side in comparison with the second measuring unit 162, and specifies that the clogging occurring site is the site of the downstream side in comparison with the second measuring unit 162.

As described above, in the clogging detection unit 18b according to the present exemplary embodiment, the clogging occurring site may be easily specified based on the measurement result of the second measuring unit 162. Specifically, in the clogging detection unit 18b according to the present exemplary embodiment, it may be easily specified whether the clogging occurring site is the upstream side or the downstream side in comparison with the second measuring unit 162, by determining whether the pressure P2 as the measurement result of the second measuring unit 162 has decreased to be lower than the first pressure.

In addition, the substrate processing system 1 includes a notification unit 210, and when clogging is detected, the clogging detection unit 18b notifies a user of the clogging through the notification unit 210. As the notification unit 210, for example, a display or a buzzer may be used, and when clogging is detected, for example, displaying or buzzer sounding which indicates the occurrence of the clogging is performed.

Subsequently, the cleaning processing for the exhaust pipe 100 or the recovery cup exhaust pipe 110 will be described. When the clogging detection unit 18b detects clogging and specifies the clogging occurring site, the clogging detection unit 18b outputs, to the cleaning controller 18c, a signal indicating a clogging state such as, for example, the specified clogging occurring site, the valve opening degree of the regulation valve 150, or the pressure P2.

When the signal indicating the clogging state is input, the cleaning controller 18c performs the cleaning processing according to the clogging state. Specifically, the cleaning controller 18c performs the cleaning processing according to the cleaning control information 19d stored in the storage unit 19. In addition, the cleaning control information 19d is information that associates the clogging occurring site with one of the cleaning liquid supply units 80, 180, and 280 which may appropriately clean the clogging occurring site.

For example, when the clogging occurring site is the upstream side of the exhaust pipe 100 in comparison with the second measuring unit 162, the cleaning controller 18c performs the cleaning processing by using the upstream cleaning liquid supply unit 180 and the recovery cup cleaning liquid supply unit 80.

That is, the cleaning controller 18c opens the valve 60g and the valve 60e (see FIG. 4) at a preset time. As a result, as represented by a solid line arrow D1 in FIG. 4, the DIW supplied from the DIW supply source 70g is ejected from the nozzle 181 to be introduced into the exhaust pipe 100. Further, as represented by a dashed line arrow D2 in FIG. 4, the DIW supplied from the DIW supply source 70e is ejected from the nozzle 81 to be introduced into the exhaust pipe 100 through the recovery cup exhaust pipe 110. In addition, it is assumed that the nozzle 81 is controlled in advance by the cleaning controller 18c to be directed toward the exhaust port 52 of the recovery cup 50 (see FIG. 3).

Accordingly, while washing off the product A attached to the upstream side of the exhaust pipe 100 in comparison with the second measuring unit 162 or the recovery cup exhaust pipe 110, the DIW is discharged to the outside through the drain unit 300 so that the product A in, for example, the exhaust pipe 100 may be removed.

In addition, for example, when the clogging occurring site is the downstream side of the exhaust pipe 100 in comparison with the second measuring unit 162, the cleaning controller 18c performs the cleaning processing by using the downstream cleaning liquid supply unit 280.

That is, the cleaning controller 18c opens the valve 60h at a preset time. As a result, as represented by an alternate long and short dashed line arrow D3 in FIG. 4, the DIW supplied from the DIW supply source 70h is ejected from the nozzle 281 to be introduced into the exhaust pipe 100.

Accordingly, while washing off the product A attached to the downstream side of the exhaust pipe 100 in comparison with the second measuring unit 162, the DIW is discharged to the outside through the drain unit 300 so that the product A of the exhaust pipe 100 may be removed.

As described above, in the cleaning controller 18c according to the present exemplary embodiment, when clogging in, for example, the exhaust pipe 100 is detected by the clogging detection unit 18b, at least one of the upstream cleaning liquid supply unit 180, the recovery cup cleaning liquid supply unit 80, and the downstream cleaning liquid supply unit 280 is controlled to perform the cleaning processing. Therefore, in the present exemplary embodiment, an unnecessary cleaning processing is hardly performed so that the increase of the cleaning liquid consumption or the reduction of throughput may be suppressed.

In addition, in the cleaning controller 18c, the cleaning liquid supply unit to perform the cleaning processing is switched among the upstream cleaning liquid supply unit 180, the recovery cup cleaning liquid supply unit 80, and the downstream cleaning liquid supply unit 280 depending on the clogging occurring site specified by the clogging detection unit 18b. Therefore, it becomes possible to perform the cleaning processing only at a portion required to be subject to the cleaning processing so that the cleaning liquid consumption may be reduced, and the maintenance time is also reduced, thereby, improving the throughput.

In addition, as described above, the upstream cleaning liquid supply unit 180 is disposed relatively close to the second measuring unit 162. Therefore, the upstream cleaning liquid supply unit 180 may supply the cleaning liquid over the wide range of the site of the upstream side in comparison with the second measuring unit 162, compared to a case where the upstream cleaning liquid supply unit 180 is disposed relatively distant from the second measuring unit 162, so that the site of the upstream side in comparison with the second measuring unit 162 may be effectively cleaned.

<4. Specific Operation of Substrate Processing System>

Next, the clogging detection processing performed in the above-described substrate processing system 1 will be described. Here, prior to describing the clogging detection processing, a series of substrate processings performed in the substrate processing system 1 according to the present exemplary embodiment and a feedback control of the regulation valve 150 will be described.

Figure 6:
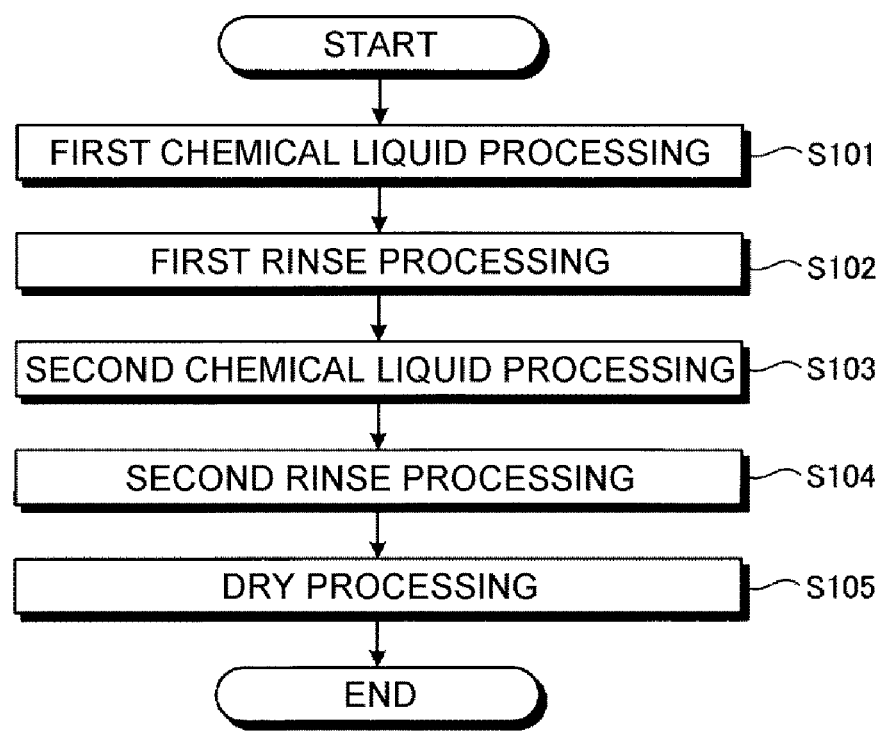
FIG. 6 is a flowchart illustrating an exemplary processing sequence of substrate processings performed in the substrate processing system.

FIG. 6 is a flowchart illustrating an exemplary processing sequence of substrate processings performed in the substrate processing system 1. It is assumed that the series of substrate processings represented in FIG. 6 are performed by, for example, a substrate processing performing unit (not illustrated) of the control unit 18.

As illustrated in FIG. 6, the control unit 18 first performs a first chemical liquid processing (Step S101). In the first chemical liquid processing, first, the driving unit 33 rotates the holding unit 31 so as to rotate the wafer W held in the holding unit 31 with a preset number of rotations. Subsequently, the control unit 18 causes the nozzle 41 of the processing fluid supply unit 40 to be disposed above the center of the wafer W. Thereafter, the control unit 18 opens the valve 60a at a preset time so as to cause the SC1 supplied from the alkali-based processing liquid supply source 70a to be supplied to the processing target surface of the wafer W from the nozzle 41. The SC1 supplied to the wafer W is spread over the entire processing target surface of the wafer W by the centrifugal force caused from the rotation of the wafer W. As a result, the processing target surface of the wafer W is processed with the SC1.

Subsequently, the control unit 18 performs a first rinse processing (Step S102). In the first rinse processing, the control unit 18 opens the valve 60d at a preset time so as to cause the DIW supplied from the DIW supply source 70d to be supplied to the processing target surface of the wafer W from the nozzle 41. As a result, the SC1 remaining on the wafer W is washed off by the DIW.

Subsequently, the control unit 18 performs a second chemical liquid processing (Step S103). In the second chemical liquid processing, the control unit 18 opens the valve 60b at a preset time so as to cause the HF supplied from the acid-based processing liquid supply source 70b to be supplied to the processing target surface of the wafer W from the nozzle 41. The HF supplied to the wafer W is spread over the entire processing target surface of the wafer W by the centrifugal force caused from the rotation of the wafer W. As a result, the processing target surface of the wafer W is processed with the HF.

Subsequently, the control unit 18 performs a second rinse processing (Step S104). In the second rinse processing, the control unit 18 opens the valve 60d at a preset time so as to cause the DIW supplied from the DIW supply source 70d to be supplied to the processing target surface of the wafer W from the nozzle 41. As a result, the HF remaining on the wafer W is washed off by the DIW.

Subsequently, the control unit 18 performs a dry processing (Step S105). In the dry processing, the control unit 18 opens the valve 60c at a preset time so as to cause the IPA supplied from the organic-based supply source 70c to be supplied to the processing target surface of the wafer W from the nozzle 41. The IPA supplied to the wafer W is spread over the entire processing target surface of the wafer W by the centrifugal force caused from the rotation of the wafer W. As a result, the DIW remaining on the processing target surface of the wafer W is replaced with the IPA having higher volatility than that of the DIW. Thereafter, the control unit 18 dries the wafer W by accelerating the rotation speed of the wafer W to shake off the IPA on the wafer W.

Figure 7:
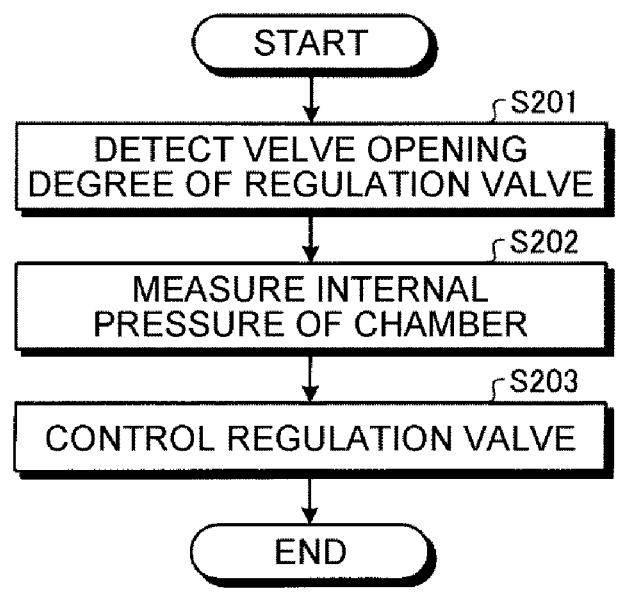
FIG. 7 is a flowchart illustrating a feedback control performed in the substrate processing system.

In the substrate processing system 1, the valve opening degree of the regulation valve 150 is controlled such that the internal pressure P1 of the chamber 20 is kept within a preset specified range. FIG. 7 is a flowchart illustrating a feedback control performed in the substrate processing system 1. Here, it is assumed that the feedback control is performed in parallel with the substrate processings.

As illustrated in FIG. 7, the valve controller 18a of the control unit 18 detects the valve opening degree of the regulation valve 150 by using the detection unit 151 (Step S201). Subsequently, the valve controller 18a measures the internal pressure P1 of the chamber 20 by the first measuring unit 161 (Step S202). Subsequently, the valve controller 18a controls the valve opening degree of the regulation valve 150 such that the internal pressure P1 of the chamber 20 is kept within the specified range (Step S203). The processings of Step S201 to S203 are performed repeatedly.

Figure 8:
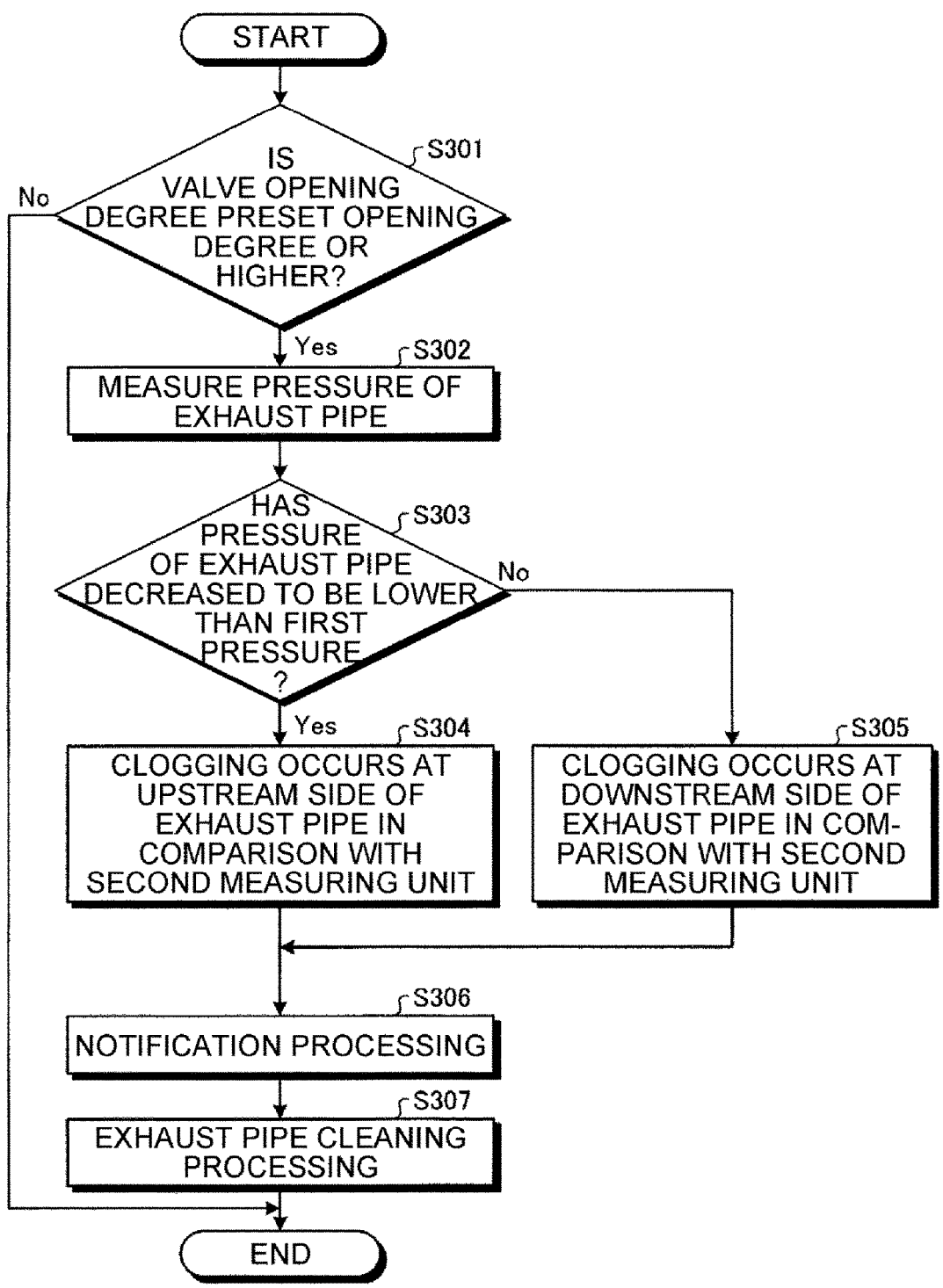
FIG. 8 is a flowchart illustrating an exemplary processing, performed in the substrate processing system, of detecting an occurrence of clogging of, for example, an exhaust pipe and cleaning the exhaust pipe.

Next, the clogging detection and the cleaning processing in, for example, the exhaust pipe 100 will be described with reference to FIG. 8. FIG. 8 is a flowchart illustrating an exemplary processing, performed in the substrate processing system 1, of detecting an occurrence of clogging of, for example, the exhaust pipe 100 and cleaning, for example, the exhaust pipe 100.

The clogging detection unit 18b of the control unit 18 determines whether the valve opening degree of the regulation valve 150 is the preset opening degree or higher (Step S301). When it is determined that the valve opening degree is less than the preset opening degree (No of Step S301), the clogging detection unit 18b ends the current processing. Meanwhile, when it is determined that the valve opening degree is the preset opening degree or higher (Yes of Step S301), the clogging detection unit 18b performs the processing after Step S302 to specify a clogging occurring site since it is estimated that clogging has occurred in, for example, the exhaust pipe 100.

Specifically, the clogging detection unit 18b measures the pressure P2 of the exhaust pipe 100 by the second measuring unit 162 (Step S302). Subsequently, the clogging detection unit 18b determines whether the pressure P2 of the exhaust pipe 100 has decreased to be lower than the first pressure (Step S303).

When it is determined that the pressure P2 of the exhaust pipe 100 has decreased to be lower than the first pressure (Yes of Step S303), the clogging detection unit 18b specifies the site of the upstream side of the exhaust pipe 100 in comparison with the second measuring unit 162 as a clogging occurring site (Step S304)

Meanwhile, when it is determined that the pressure P2 of the exhaust pipe 100 has not decreased to be lower than the first pressure (No of Step S303), that is, when it is determined that the pressure P2 is increasing, the clogging detection unit 18b specifies the downstream side of the exhaust pipe 100 in comparison with the second measuring unit 162 as a clogging occurring site (Step S305).

Subsequently, the clogging detection unit 18b notifies a user of the clogging occurring site specified in Steps S304 and S305 through the notification unit 210 (Step S306).

Then, the cleaning controller 18c performs the cleaning processing of the exhaust pipe 100 depending on the clogging occurring site. In addition, the cleaning controller 18c performs the cleaning processing of the exhaust pipe 100 after the above-described substrate processings are ended, and the wafer W is carried out from the processing unit 16. The timing for the cleaning processing of the exhaust pipe 100 is not limited thereto. That is, the feedback control, the clogging detection, and the cleaning processing may be performed, for example, during a standby time when the wafer W is not processed. In this case, the cleaning processing is performed in a case where clogging of the exhaust pipe 100 is detected.

When the clogging occurring site is the site of the upstream side of the exhaust pipe 100 in comparison with the second measuring unit 162, the cleaning controller 18c operates the upstream cleaning liquid supply unit 180 and the recovery cup cleaning liquid supply unit 80. Accordingly, the DIW is supplied to the site of the upstream side of the exhaust pipe 100 in comparison with the second measuring unit 162 so that the exhaust pipe 100 is cleaned (see the arrows D1 and D2 of FIG. 4).

In addition, when the clogging occurring site is the site of the downstream side of the exhaust pipe 100 in comparison with the second measuring unit 162, the cleaning controller 18c operates the downstream cleaning liquid supply unit 280. Accordingly, the DIW is supplied to the site of the downstream side of the exhaust pipe 100 in comparison with the second measuring unit 162 so that the exhaust pipe 100 is cleaned (see the arrow D3 of FIG. 4).

In addition, in the above descriptions, the upstream cleaning liquid supply unit 180, the recovery cup cleaning liquid supply unit 80, and the downstream cleaning liquid supply unit 280 are provided, but the present disclosure is not limited to this configuration. That is, for example, any one of or all the upstream cleaning liquid supply unit 180, the recovery cup cleaning liquid supply unit 80, and the downstream cleaning liquid supply unit 280 may not be provided such that the cleaning of the exhaust pipe 100 is performed by a user.

That is, for example, the downstream cleaning liquid supply unit 280 may not be provided. In this case, an inspection port (not illustrated) is provided at an appropriate position of the downstream side of the exhaust pipe 100 in comparison with the second measuring unit 162, and the cleaning by a user is performed from the inspection port.

In addition, as described above, the downstream cleaning liquid supply unit 280 may not be provided, and this is because the site of the downstream side of the exhaust pipe 100 is disposed vertically above the site of the upstream side of the exhaust pipe 100.

That is, the product A contained in the exhaust flowing through the exhaust pipe 100 is attached to the exhaust pipe 100 at the upstream side thereof in comparison with the second measuring unit 162 prior to arriving at the downstream side of the measuring unit 162, or drops from the ascending portion 100c of the exhaust pipe 100 to be discharged from the drain unit 300.

Hence, the downstream cleaning liquid supply unit 280 may not be provided at the downstream side in comparison with the second measuring unit 162 to which the product A is hardly attached. Thus, the configuration of the substrate processing system 1 may be simplified, and a cost reduction may be implemented.

As described above, the substrate processing system 1 according to the first exemplary embodiment (an example of the substrate processing apparatus) includes the first measuring unit 161, the exhaust pipe 100, the regulation valve 150, the opening degree detection unit 151, the valve controller 18a, and the clogging detection unit 18b. The chamber 20 accommodates therein the wafer W to be processed by using a processing fluid. The first measuring unit 161 measures the internal pressure P1 of the chamber 20. The exhaust pipe 20 is connected to the chamber 20, and the exhaust from the chamber 20 flows through the exhaust pipe 100. The regulation valve 150 is provided in the exhaust pipe 100, and regulates the exhaust volume of the exhaust pipe 100.

The opening degree detection unit 151 detects the valve opening degree of the regulation valve 150. The valve controller 18a controls the valve opening degree of the regulation valve 150 based on the measurement result of the first measuring unit 161 so as to keep the internal pressure P1 within a specified range. The clogging detection unit 18b detects clogging of the exhaust pipe 100 based on the valve opening degree detected by the opening degree detection unit 151. Accordingly, an occurrence of clogging in the exhaust pipe 100 may be easily detected.

(Second Exemplary Embodiment)

<5. Configuration of Substrate Processing System According to Second Exemplary Embodiment>

Subsequently, a substrate processing system 1 according to a second exemplary embodiment will be described. In the following descriptions, portions identical to the already described portions will be denoted by the same reference numerals as used for the already described portions, and overlapping descriptions will be omitted.

In the second exemplary embodiment, a pressure P3 of the recovery cup exhaust pipe 110 is measured, and it is specified which one of the exhaust pipe 100 and the recovery cup exhaust pipe 110 is the clogging occurring site, based on, for example, the measured pressure P3.

More specifically, the processing unit 16 according to the second exemplary embodiment further includes a chamber cleaning liquid supply unit 90 and a third measuring unit 163 as represented by an imaginary line in FIG. 3.

The chamber cleaning liquid supply unit 90 is used for a chamber cleaning processing of cleaning the inner wall of the chamber 20. The chamber cleaning liquid supply unit 90 includes a nozzle 91, an arm 92 that supports the nozzle 91, and a pivoting and lifting mechanism 93 that pivots and lifts the arm 92.

The nozzle 91 is connected to a DIW supply source 70f through a valve 60f. This chamber cleaning liquid supply unit 90 ejects DIW supplied from the DIW supply source 70f as a cleaning liquid toward the inner wall of the chamber 20 from the nozzle 91 so as to clean the chamber 20.

In addition, the chamber cleaning liquid supply unit 90 is configured to also supply the DIW to the exhaust port 24 of the chamber 20. The chamber cleaning liquid supply unit 90 is also used for the processing of cleaning the exhaust pipe 100 by supplying the DIW to the exhaust port 24, and this will be described later. In addition, the chamber cleaning liquid supply unit 90 is an example of the cleaning liquid supply unit.

The third measuring unit 163 is provided in the recovery cup exhaust pipe 110 and measures the pressure P3 of the recovery cup exhaust pipe 110. The third measuring unit 163 outputs a signal indicating a measurement result to the control device 4. In addition, as the third measuring unit 163, for example, a pressure sensor may be used.

In the processing unit 16 configured as described above, the chamber cleaning liquid supply unit 90 is also controlled by the control device 4. That is, as represented by an imaginary line in FIG. 5, a signal indicating the pressure P3 of the recovery cup exhaust pipe 110 measured by the third measuring unit 163, in addition to the valve opening degree of the regulation valve 150 and the pressure P2 of the exhaust pipe 100, is input to the clogging detection unit 18b.

Then, the clogging detection unit 18b detects clogging of the exhaust pipe 100 and specifies a clogging occurring site based on the valve opening degree of the regulation valve 150 and the pressures P2 and P3. Specifically, as described above, when the pressure P2 has decreased to be lower than the first pressure, the clogging detection unit 18b specifies that the clogging occurring site is the site of the upstream side in comparison with the second measuring unit 162.

Here, the "site of the upstream side in comparison with the second measuring unit 162" includes the exhaust pipe 100 and the recovery cup exhaust pipe 110 extending from the chamber 20 to the second measuring unit 162.

Thus, in the clogging detection unit 18b according to the second exemplary embodiment, when it is specified that the clogging occurring site is the site of the upstream side in comparison with the second measuring unit 162, it is further specified which one of the exhaust pipe 100 and the recovery cup exhaust pipe 110 extending from the chamber 20 to the second measuring unit 162 is the clogging occurring site.

Specifically, when it is specified that the clogging occurring site is the site of the upstream side in comparison with the second measuring unit 162, the clogging detection unit 18b measures the pressure P3 of the recovery cup exhaust pipe 110 by the third measuring unit 163. Then, when the measured pressure P3 has decreased to be lower than a second pressure, the clogging detection unit 18b estimates that the decrease is attributed to the reduction of the flow path cross-sectional area in the recovery cup exhaust pipe 110, and specifies that the clogging occurring site is the recovery cup exhaust pipe 110.

In addition, the second pressure is set to a value of the pressure P3 measured when no clogging occurs in the exhaust pipe 100, and the second set pressure is stored in advance as the first pressure information 19e in the storage unit 19.

Meanwhile, when the pressure P3 has not decreased to be lower than the second pressure, that is, when the pressure P3 is identical or substantially identical to the second pressure or has increased, the clogging detection unit 18b estimates that the flow path cross-sectional area in the exhaust pipe 100 extending from the chamber 20 to the second measuring unit 162 has been reduced. That is, the clogging detection unit 18b specifies that the clogging occurring site is the exhaust pipe 100 extending from the chamber 20 to the second measuring unit 162, excluding the recovery cup exhaust pipe 110, in the site of the upstream side in comparison with the second measuring unit 162.

As described above, in the second exemplary embodiment, it may be easily specified which one of the exhaust pipe 100 and the recovery cup exhaust pipe 110 is the clogging occurring site, based on the measurement result of the third measuring unit 163.

For example, when the clogging occurring site is the site of the upstream side of the exhaust pipe 100 in comparison with the second measuring unit 162 and is not the recovery cup exhaust pipe 110, the cleaning controller 18c performs the cleaning processing by using the upstream cleaning liquid supply unit 180 and the chamber cleaning liquid supply unit 90.

That is, the cleaning controller 18c opens the valve 60g and the valve 60f (see FIG. 4) at a preset time. As a result, as represented by the arrow D1 in FIG. 4, the DIW is introduced into the exhaust pipe 100, and as represented by an alternate long and two short dashed line arrow D4 in FIG. 4, the DIW supplied from the DIW supply source 70f is ejected from the nozzle 91 to be introduced into the exhaust pipe 100. In addition, it is assumed that the nozzle 91 is controlled in advance by the cleaning controller 18c to be directed toward the exhaust port 24 of the chamber 20 (see FIG. 3).

Accordingly, while washing off the product A attached to the exhaust pipe 100, the DIW is discharged to the outside through the drain unit 300 so that the product A of the exhaust pipe 100 may be removed.

In addition, for example, when it is specified that the clogging occurring site is the recovery cup exhaust pipe 110, the cleaning controller 18c performs the cleaning processing by using the recovery cup cleaning liquid supply unit 80.

That is, the cleaning controller 18c opens the valve 60e (see FIG. 4) at a preset time. As a result, as represented by the arrow D2 in FIG. 4, the DIW is introduced into the recovery cup exhaust pipe 110. In addition, it is assumed that the nozzle 81 is controlled in advance by the cleaning controller 18c to be directed toward the exhaust port 52 of the recovery cup 50 (see FIG. 3).

Accordingly, while washing off the product A attached to the recovery cup exhaust pipe 110, the DIW is discharged to the outside through the exhaust pipe 100 and the drain unit 300 so that the product A of the recovery cup exhaust pipe 110 may be removed.

<6. Specific Operation of Substrate Processing System According to Second Exemplary Embodiment>

Figure 9:
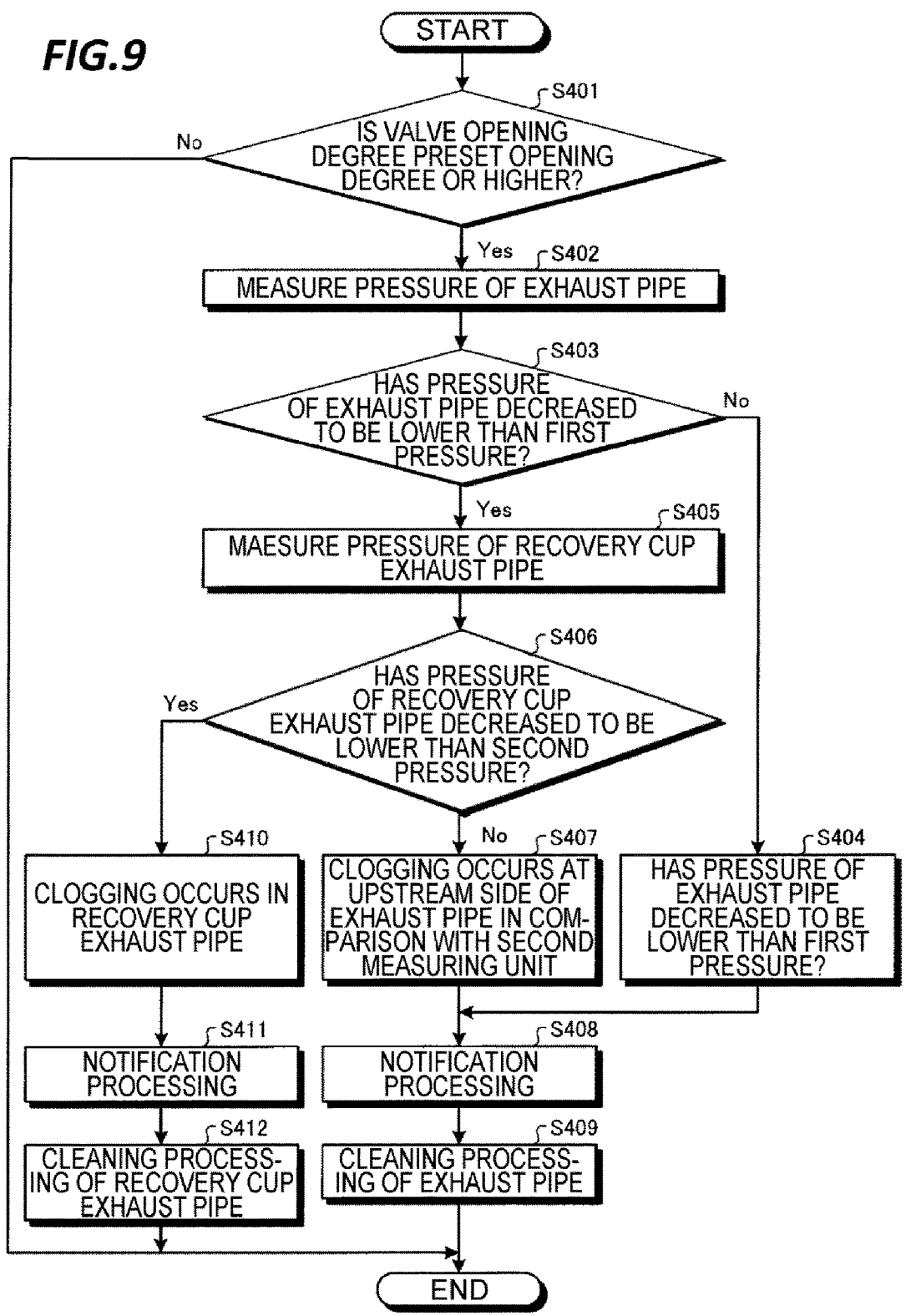
FIG. 9 is a flowchart illustrating an exemplary processing, performed in a substrate processing system according to a second exemplary embodiment, of detecting an occurrence of clogging of, for example, an exhaust pipe and cleaning the exhaust pipe.

Next, the clogging detection and the cleaning processing in, for example, the exhaust pipe 100 according to the second exemplary embodiment will be described with reference to FIG. 9. FIG. 9 is a flowchart illustrating an exemplary processing, performed in the substrate processing system 1 according to the second exemplary embodiment, of detecting an occurrence of clogging of, for example, the exhaust pipe 100 and cleaning, for example, the exhaust pipe 100. In FIG. 9, since the processings of Steps S401 to S403 are identical to the above-described processings of S301 to S303, descriptions thereof will be omitted.

As illustrated in FIG. 9, when it is determined that the pressure P2 of the exhaust pipe 100 has not decreased to be lower than the first pressure (No of Step S403), the clogging detection unit 18b specifies that the clogging occurring site is the downstream side of the exhaust pipe 100 in comparison with the second measuring unit 162.

Meanwhile, when it is determined that the pressure P2 of the exhaust pipe 100 has decreased to be lower than the first pressure (Yes of Step S403), the clogging detection unit 18b subsequently measures the pressure P3 of the recovery cup exhaust pipe 110 by the third measuring unit 163 (Step S405).

Subsequently, the clogging detection unit 18b determines whether the pressure P3 of the recovery cup exhaust pipe 110 has decreased to be lower than the second pressure (Step S406). When it is determined that the pressure P3 has not decreased to be lower than the second pressure (No of Step S406), the clogging detection unit 18b specifies that the clogging occurring site is the site of the upstream side of the exhaust pipe 100 in comparison with the second measuring unit 162, excluding the recovery cup exhaust pipe 110 (Step S407).

Subsequently, the clogging detection unit 18b notifies a user of the clogging occurring site specified in Steps S404 and S407 through the notification unit 210 (Step S408).

Then, the cleaning controller 18c performs the cleaning processing of the exhaust pipe 100 depending on the clogging occurring site (Step S409). Specifically, when the clogging occurring site is the site of the upstream side of the exhaust pipe 100 in comparison with the second measuring unit 162, the cleaning controller 18c operates the upstream cleaning liquid supply unit 180 and the chamber cleaning liquid supply unit 90. Accordingly, the DIW is supplied to the site of the upstream side of the exhaust pipe 100 in comparison with the second measuring unit 162 so that the exhaust pipe 100 is cleaned (see the arrows D1 and D4 of FIG. 4).

In addition, when the clogging occurring site is the site of the downstream side of the exhaust pipe 100 in comparison with the second measuring unit 162, the cleaning controller 18c operates the downstream cleaning liquid supply unit 280. Accordingly, the DIW is supplied to the site of the downstream side of the exhaust pipe 100 in comparison with the second measuring unit 162 so that the exhaust pipe 100 is cleaned (see the arrow D3 of FIG. 4).

Meanwhile, when it is determined that the pressure P3 has decreased to be lower than the second pressure (Yes of Step S406), the clogging detection unit 18b specifies the recovery cup exhaust pipe 110 as the clogging occurring site (Step S410).

Subsequently, the clogging detection unit 18b notifies a user of the effect that the recovery cup exhaust pipe 110 is the clogging occurring site, through the notification unit 210 (Step S411).

Then, the cleaning controller 18c performs the cleaning processing of the recovery cup exhaust pipe 110 (Step S412). Specifically, the cleaning controller 18c operates the recovery cup cleaning liquid supply unit 80. Accordingly, the DIW is supplied into the recovery cup exhaust pipe 110 so that the recovery cup exhaust pipe 110 is cleaned (see the arrow D2 of FIG. 4).

As described above, in the second exemplary embodiment, the pressure P3 of the recovery cup exhaust pipe 110 is measured, and it is specified which one of the exhaust pipe 100 and the recovery cup exhaust pipe 110 is the clogging occurring site, based on, for example, the measured pressure P3. Thus, when clogging occurs in, for example, the exhaust pipe 100, the clogging occurring site may be easily specified.

In addition, in the above-described exemplary embodiments, the DIW to be supplied to the exhaust pipe 100 or the recovery cup exhaust pipe 110 is ejected from the nozzle 81 of the recovery cup cleaning liquid supply unit 80 or the nozzle 91 of the chamber cleaning liquid supply unit 90, but is not limited thereto. That is, for example, the nozzle 41 may be configured to move to be positioned above the exhaust port 24 or the exhaust port 52 to eject the DIW such that the DIW is supplied from the nozzle 41 into the exhaust pipe 100 or the recovery cup exhaust pipe 110.

In addition, in the above descriptions, the attachment of the product A is described as an example of the clogging occurring in the exhaust pipe 100, but the clogging is not limited thereto. That is, for example, a deterioration of the exhaust pipe 100, a malfunction of the regulation valve 150, or clogging of a filter (not illustrated) may be detected as the clogging of the exhaust pipe 100.

In addition, in the above descriptions, the valve opening degree of the regulation valve 150 is detected by using the encoder as the opening degree detection unit 151, but the present disclosure is not limited thereto. For example, the valve opening degree may be detected based on, for example, a command value output to the regulation valve 150 from the valve controller 18a.

In addition, the above-described cleaning control information 19d may include time for the cleaning processing. That is, since the signal indicating the clogging state includes the valve opening degree of the regulation valve 150 and the pressures P2 and P3, time for the cleaning processing may be set depending on the extent of, for example, the valve opening degree of the regulation valve 150, and the set time for the cleaning processing may be stored in advance as the cleaning control information 19d in the storage unit 19.

Specifically, for example, when the valve opening degree of the regulation valve 150 is far higher than the preset opening degree, it is estimated that the amount of the product A is relatively large. Thus, the time for the cleaning processing may be set to be long. In addition, when the pressures P2 and P3 relatively largely fluctuate in comparison with the first and second pressures, the time for the cleaning processing may be set to be long, for the same reason as described above. Therefore, it becomes possible to perform the cleaning processing for an appropriate time period depending on the amount of the product A attached to the exhaust pipe 100 so that the product A may be effectively removed.

In addition, in the above descriptions, the first and second pressures are set to the values measured when no clogging occurs in the exhaust pipe 100, but are not limited thereto. That is, for example, values when no clogging occurs in the exhaust pipe 100 may be calculated in advance through, for example, tests, and the values may be stored as the first and second pressures in the storage unit 19.

In addition, in the above descriptions, the DIW is supplied from each of the DIW supply sources 70d, 70e, 70f, 70g, and 70h to each of the nozzles 41, 81, 91, 181, and 281, but the present disclosure is not limited thereto. That is, for example, the DIW may be supplied from a single DIW supply source to the nozzles 41, 81, 91, 181, and 281 through pipes branched from the midway of the single DIW supply source.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing apparatus comprising:
a chamber configured to accommodate therein a substrate to be processed by using a processing fluid;
a first measuring unit configured to measure an internal pressure of the chamber;
an exhaust pipe connected to the chamber to allow an exhaustion from the chamber to flow therethrough;
a regulation valve provided in the exhaust pipe and configured to regulate an exhaust volume of the exhaust pipe;
an opening degree detection unit configured to detect a valve opening degree of the regulation valve;
a valve controller configured to control the valve opening degree of the regulation valve based on a measurement result of the first measuring unit to keep the internal pressure within a specified range;
a clogging detection unit configured to detect clogging of the exhaust pipe based on the valve opening degree detected by the opening degree detection unit;
a cleaning liquid supply unit configured to supply a cleaning liquid into the exhaust pipe; and
a cleaning controller configured to control the cleaning liquid supply unit to supply the cleaning liquid into the exhaust pipe when the clogging of the exhaust pipe is detected by the clogging detection unit.

2. The substrate processing apparatus of claim 1, further comprising
a second measuring unit provided at an upstream side of the exhaust pipe in an exhaust flow direction in comparison with the regulation valve and configured to measure a pressure of the exhaust pipe,
wherein the clogging detection unit specifies a clogging occurring site in the exhaust pipe based on the pressure of the exhaust pipe measured by the second measuring unit.

3. The substrate processing apparatus of claim 2, wherein the clogging detection unit specifies that the clogging occurring site is a site of the upstream side in the exhaust flow direction in comparison with the second measuring unit when the pressure of the exhaust pipe measured by the second measuring unit has decreased to be lower than a preset pressure, and specifies that the clogging occurring site is a site of a downstream side in comparison with the second measuring unit when the pressure of the exhaust pipe has increased to be higher than the preset pressure.

4. A substrate processing apparatus comprising:
a chamber configured to accommodate therein a substrate to be processed by using a processing fluid;
a first measuring unit configured to measure an internal pressure of the chamber;
an exhaust pipe connected to the chamber to allow an exhaustion from the chamber to flow therethrough;
a regulation valve provided in the exhaust pipe and configured to regulate an exhaust volume of the exhaust pipe;
an opening degree detection unit configured to detect a valve opening degree of the regulation valve;
a valve controller configured to control the valve opening degree of the regulation valve based on a measurement result of the first measuring unit to keep the internal pressure within a specified range;
a clogging detection unit configured to detect clogging of the exhaust pipe based on the valve opening degree detected by the opening degree detection unit; and
a second measuring unit provided at an upstream side of the exhaust pipe in an exhaust flow direction in comparison with the regulation valve and configured to measure a pressure of the exhaust pipe, wherein the clogging detection unit specifies a clogging occurring site in the exhaust pipe based on the pressure of the exhaust pipe measured by the second measuring unit, and the clogging detection unit specifies that the clogging occurring site is a site of the upstream side in the exhaust flow direction in comparison with the second measuring unit when the pressure of the exhaust pipe measured by the second measuring unit has decreased to be lower than a preset pressure, and specifies that the clogging occurring site is a site of a downstream side in comparison with the second measuring unit when the pressure of the exhaust pipe has increased to be higher than the preset pressure.

5. The substrate processing apparatus of claim 4, wherein the exhaust pipe is disposed such that the site of the downstream side in the exhaust flow direction is positioned vertically above the site of the upstream side, and an upstream cleaning liquid supply unit is provided at the upstream side of the exhaust pipe in comparison with the second measuring unit to supply the cleaning liquid into the exhaust pipe.

6. The substrate processing apparatus of claim 4, further comprising:
    a substrate holding mechanism disposed within the chamber and configured to hold a substrate;
    a recovery cup disposed to surround the substrate held by the substrate holding mechanism and configured to recover a drainage in a substrate processing;
    a recovery cup exhaust pipe connected to the recovery cup to allow exhaust from the recovery cup to flow therethrough, and joining with the exhaust pipe at the downstream side in the exhaust flow direction; and
    a third measuring unit provided in the recovery cup exhaust pipe and configured to measure a pressure of the recovery cup exhaust pipe,
    wherein the clogging detection unit specifies which one of the exhaust pipe and the recovery cup exhaust pipe is the clogging occurring site, based on the pressure of the exhaust pipe measured by the second measuring unit and the pressure of the recovery cup exhaust pipe measured by the third measuring unit.

7. A method for detecting clogging of an exhaust pipe in a substrate processing apparatus, which includes: a chamber configured to accommodate therein a substrate to be processed by using a processing fluid; a first measuring unit configured to measure an internal pressure of the chamber; an exhaust pipe connected to the chamber to allow exhaust from the chamber to flow therethrough; a regulation valve provided in the exhaust pipe and configured to regulate an exhaust volume of the exhaust pipe; an opening degree detection unit configured to detect a valve opening degree of the regulation valve; a valve controller configured to control the valve opening degree of the regulation valve; and a clogging detection unit configured to detect clogging of the exhaust pipe, the method comprising:
    measuring an internal pressure of the chamber by the first measuring unit;
    detecting a valve opening degree of a regulation valve by the opening degree detection unit;
    controlling the valve opening degree of the regulation valve by the valve controller based on a measurement result in the internal pressure measuring step to keep the internal pressure within a specified range;
    detecting clogging of the exhaust pipe by the clogging detection unit based on the valve opening degree detected by the opening degree detecting step;
    wherein the substrate processing apparatus further includes a cleaning liquid supply unit configured to supply a cleaning liquid into the exhaust pipe, and a cleaning controller configured to control the cleaning liquid supply unit to supply the cleaning liquid into the exhaust pipe, and
    the method further comprises supplying the cleaning liquid into the exhaust pipe from the cleaning liquid supply unit when clogging of the exhaust pipe is detected by the clogging detection unit.

8. The method of claim 7, wherein the substrate processing apparatus further includes a second measuring unit provided at an upstream side of the exhaust pipe in an exhaust flow direction in comparison with the regulation valve and configured to measure a pressure of the exhaust pipe, and the clogging detection unit specifies a clogging occurring site in the exhaust pipe based on the pressure of the exhaust pipe measured by the second measuring unit.

* * * * *